(12) United States Patent
Tan et al.

(10) Patent No.: US 7,377,991 B2
(45) Date of Patent: May 27, 2008

(54) ULTRASONIC ASSISTED ETCH USING CORROSIVE LIQUIDS

(75) Inventors: Samantha Tan, Union City, CA (US); Ning Chen, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 11/477,191

(22) Filed: Jun. 27, 2006

(65) Prior Publication Data

US 2006/0243390 A1 Nov. 2, 2006

Related U.S. Application Data

(62) Division of application No. 10/627,416, filed on Jul. 24, 2003, now Pat. No. 7,091,132.

(51) Int. Cl.
*H01L 21/306* (2006.01)

(52) U.S. Cl. .............................. 156/345.1; 156/345.11; 156/345.18; 438/745

(58) Field of Classification Search ................ 438/745, 438/750; 156/345.11, 345.18
See application file for complete search history.

(56) References Cited

U.S. PATENT DOCUMENTS

| | | | |
|---|---|---|---|
| 3,764,379 A | 10/1973 | Tuttle | |
| 3,775,202 A * | 11/1973 | Meek et al. | 216/86 |
| 3,969,195 A | 7/1976 | Dötzer et al. | |
| 3,986,653 A | 10/1976 | Gilding | |
| 3,992,454 A | 11/1976 | Kessler | |
| 4,023,936 A | 5/1977 | Morse et al. | |
| 4,078,963 A | 3/1978 | Symersky | |
| 4,101,386 A | 7/1978 | Dötzer et al. | |
| 4,139,348 A | 2/1979 | Swartz | |
| 4,197,631 A | 4/1980 | Meyer et al. | |
| 4,214,952 A | 7/1980 | Sato et al. | |
| 4,232,060 A | 11/1980 | Mallory, Jr. | |
| 4,272,612 A | 6/1981 | Oliver | |
| 4,327,134 A | 4/1982 | Baldi | |
| 4,367,119 A | 1/1983 | Logan et al. | |

(Continued)

FOREIGN PATENT DOCUMENTS

JP 50-087974 5/1987

(Continued)

OTHER PUBLICATIONS

Hoffman, H.S., Molybdenum Cleaning Solution, IBM Technical Disclosure Bulletin, 3(5):36,(1960).

(Continued)

*Primary Examiner*—Lan Vinh
(74) *Attorney, Agent, or Firm*—Dugan & Dugan

(57) ABSTRACT

An ultrasonic etching apparatus for chemically-etching a workpiece is disclosed. The apparatus includes an outer tank at least partially filled with an aqueous solution, an inner tank at least partially disposed within the outer tank and in contact with aqueous solution, the inner tank at least partially filled with an etching solution, a lid engaged with the mouth of said inner tank; and an ultrasonic transducer coupled to the outer tank to impart ultrasonic energy to the etching solution in said inner tank. Also disclosed are methods of using the apparatus to etch workpieces.

26 Claims, 10 Drawing Sheets

U.S. PATENT DOCUMENTS

| | | | |
|---|---|---|---|
| 4,447,824 A | | 5/1984 | Logan et al. |
| 4,448,800 A | | 5/1984 | Ehara et al. |
| 4,459,155 A | | 7/1984 | Cayless |
| 4,519,914 A | | 5/1985 | Etani |
| 4,530,120 A | | 7/1985 | Etani |
| 4,579,569 A | * | 4/1986 | Sheng et al. ............ 96/265 |
| 4,638,553 A | | 1/1987 | Nilarp |
| 4,699,082 A | | 10/1987 | Hakim |
| 4,863,561 A | | 9/1989 | Freeman et al. |
| 4,957,583 A | | 9/1990 | Buck et al. |
| 4,971,590 A | | 11/1990 | Tong |
| 4,980,017 A | * | 12/1990 | Kaji et al. ............ 216/93 |
| 5,104,501 A | | 4/1992 | Okabayashi |
| 5,152,878 A | | 10/1992 | Datta et al. |
| 5,221,421 A | * | 6/1993 | Leibovitz et al. ............ 216/48 |
| 5,365,112 A | | 11/1994 | Ohshima |
| 5,516,399 A | * | 5/1996 | Balconi-Lamica et al. ..... 438/8 |
| 5,593,339 A | | 1/1997 | Yam et al. |
| 5,614,027 A | | 3/1997 | Dunn et al. |
| 5,665,473 A | | 9/1997 | Okoshi et al. |
| 5,712,198 A | | 1/1998 | Shive et al. |
| 5,744,214 A | | 4/1998 | Berasi et al. |
| 5,766,979 A | | 6/1998 | Budnaitis |
| 5,840,402 A | | 11/1998 | Roberts et al. |
| 5,853,492 A | | 12/1998 | Cathey et al. |
| 5,888,308 A | | 3/1999 | Sachdev et al. |
| 5,891,354 A | * | 4/1999 | Lee et al. ............ 216/99 |
| 5,908,819 A | | 6/1999 | Reynolds et al. |
| 5,929,521 A | | 7/1999 | Wark et al. |
| 5,966,593 A | | 10/1999 | Budnaitis et al. |
| 6,012,966 A | | 1/2000 | Ban et al. |
| 6,136,724 A | * | 10/2000 | Hansen et al. ............ 438/745 |
| 6,145,096 A | | 11/2000 | Bereiter et al. |
| 6,185,606 B1 | | 2/2001 | Bereiter |
| 6,187,216 B1 | | 2/2001 | Dryer et al. |
| 6,353,885 B1 | | 3/2002 | Herzi et al. |
| 6,357,017 B1 | | 3/2002 | Bereiter et al. |
| 6,368,410 B1 | | 4/2002 | Gorczyca et al. |
| 6,477,531 B1 | | 11/2002 | Sullivan et al. |
| 6,506,254 B1 | | 1/2003 | Bosch et al. |
| 6,539,499 B1 | | 3/2003 | Stedman et al. |
| 6,542,898 B1 | | 4/2003 | Sullivan et al. |
| 6,560,726 B1 | | 5/2003 | Vrhel, Jr. et al. |
| 6,564,220 B1 | | 5/2003 | Huber et al. |
| 6,569,252 B1 | | 5/2003 | Sachdev et al. |
| 6,574,615 B1 | | 6/2003 | Huber et al. |
| 6,579,153 B2 | | 6/2003 | Uchikura et al. |
| 6,606,716 B1 | | 8/2003 | Vrhel, Jr. et al. |
| 6,615,240 B1 | | 9/2003 | Sullivan et al. |
| 6,767,840 B1 | * | 7/2004 | Uehara et al. ............ 438/745 |
| 2003/0000458 A1 | | 1/2003 | Marumo et al. |
| 2003/0066540 A1 | | 4/2003 | Sachdev et al. |
| 2003/0091835 A1 | | 5/2003 | Takahashi et al. |
| 2003/0096562 A1 | | 5/2003 | Kurogouchi |
| 2004/0000327 A1 | | 1/2004 | Somboli et al. |
| 2004/0060579 A1 | | 4/2004 | Kim et al. |
| 2004/0238487 A1 | | 12/2004 | Kiehlbauch et al. |

FOREIGN PATENT DOCUMENTS

| | | |
|---|---|---|
| JP | 11-290805 | 10/1999 |

OTHER PUBLICATIONS

Metrology for Manufacturing: Surface Measurement. [online] Michigan Technological University, undated [retrieved on Jun. 21, 2005]. Retrieved from the Internet: <URL: http://www.mfg.mtu.edu/cyberman/quality/metrology/surface.html>.

Spring, S., Metal Cleaning, Reinhold Publishing Corporation, New York, pp. 85-89, (1963).

Enis, James Hunter; White Larry W. "Solution Network Knowledge Management System" U.S. Appl. No. 10/697,173, filed Oct. 30, 2003.

Enis, James; Carden, Jason; Loranger, Michael; Sonnenstuhl, Eric; White, Larry "Solution Network Decision Trees" U.S. Appl. No. 10/696,807, filed Oct. 30, 2003.

White, Larry W.; Enis, James Hunter "Solution Network Knowledge Verification" U.S. Appl. No. 10/697,739, filed Oct. 30, 2003.

* cited by examiner

ULTRASONIC ASSISTED ETCH USING CORROSIVE LIQUIDS

CROSS-REFERENCE TO RELATED APPLICATIONS

This application is a division of U.S. patent application Ser. No. 10/627,416, filed Jul. 24, 2003, now U.S. Pat. No. 7,091,132 which is hereby incorporated by reference herein in its entirety.

FIELD OF THE INVENTION

The present invention relates to methods for ultrasonically chemical-etching workpieces, and to systems for use in practicing the invention.

BACKGROUND OF THE INVENTION

In a number of modern industrial processes it is necessary to etch materials uniformly. The etching may be confined to the material, or the etching process may be continued until the material is etched through, thereby exposing an underlying material. In many industrial applications such as, for example, the fabrication of electronic, optical or optoelectronic workpieces, the etching steps form a very critical phase of workpiece fabrication, as the etching process typically dictates the accuracy to which the workpieces are ultimately manufactured.

There are often more than one hundred processing steps in the fabrication of semiconductor chips, including oxidation, diffusion, ion implantation, deposition of conductors and insulators, photolithography and etching. Various conducting and insulating layers are deposited uniformly over the wafer to a thickness of a few microns. In critical applications, certain new or used parts of semiconductor processing equipment need to be cleaned prior to installation and use in order to remove residual contamination from the initial machining or manufacturing process, or from the processing steps, in order to achieve levels of cleanliness similar to the semiconductor wafer itself and have its surface morphology restored. Furthermore, after many wafers have been processed, the equipment used in the semiconductor processing process becomes contaminated or deposits build-up and therefore becomes unusable.

For example, in an etching machine, polymer deposits on the outer circumference of electrodes or chucks supporting the wafers until it becomes thick enough to interfere with the wafer's contact with the electrode. This results in non-uniform etching across the wafer as well as missed transfers due to a wafer sticking to polymer buildup on the electrode. Non-uniformity exceeding seven percent is beyond some specified limits, in turn affecting side wall profile variance across the wafer. In addition, other components in the equipment chamber, e.g. roofs/domes and liners are also coated with polymers and contaminants which contribute particles, metallic and organic impurities to the wafers. Therefore, it is then necessary to disassemble the parts in the equipment chamber and clean the individual parts. Most types of dry processing equipment used for the manufacture of semiconductor devices utilize processes involving high temperatures, plasmas and gaseous mixtures for film deposition and etching. During these manufacturing processes, organic and inorganic by-products are deposited on the surfaces of workpiece parts.

Some apparati and devices are commercially available to etch workpieces, however, none is ideal. FIG. 1 shows a representative small-scale apparatus 100 of the prior art used to ultrasonically etch a semiconductor fabricationworkpiece 102. An acidic solution 110 is placed into inner container 104 and ultrasonically agitated through aqueous solution 120 held in outer container 130. The entire apparatus is contained within an exhaust hood 150 for the capture of gases 140 that are emitted from the aqueous and acidic solutions as the etching reaction occurs. While representing an advance over earlier etching processes that did not include a concentrated acid or an ultrasonicator, apparatus 100 does not provide the ability to rotate workpiece 102 or create safe working conditions. Nor does apparatus 100 have capability to contain the gases or prevent unwanted components, e.g. impurities from environment and aerosol gases from the aqueous solutions, from entering the etching solution during the etching process, or to increase the partial pressure of the volatilized etching solution and to prevent change in the concentration of the etching solution due to aerosol or volatilisation losses. It also lacks a heating mechanism, probe, etc for regulating the temperature and a ultrasonic buffer for dampening and diffusing the energy for better control over the etch process.

Prior art apparatus 200 shown in FIG. 2 contains two beakers 202 and 204, which contain deionized water that is provided through opening 206, and which overflows into the beakers, which then overflows into the sonication tank 210. Ultrasonication transducer 220 is connected to power oscillator 220 to provide ultrasonic energy to the deionized water. This apparatus lacks a number of desired features, including, most significantly, the ability to contain an acid, the ability to rotate a workpiece being sonicated, a heating element, and an ultrasonic diffuser.

U.S. Pat. No. 6,199,563, which is incorporated by reference herein, adds a modest improvement to ultrasonicators of the prior art by including a rotational mechanism for sonicating a workpiece in an acid solution, but it fails to provide means for containing the acidic gases, preventing unwanted contaminants from the aqueous solution and/or rotational mechanism wear and tear from entering the acidic solution, the ability to increase the partial pressure of the acidic solution, or provide a safer working environment.

What is needed is a method and apparatus for containing the gases produced during ultrasonic agitation, minimizing exposure of the etching solution to the immediately surrounding environment which would thus prevent unwanted contaminants from the aqueous solution and/or rotational mechanism wear and tear from entering the etching solution during the etching process, the ability to increase the partial pressure of the etching solution which would inhibit the formation of dangerous vapors by keeping them in a liquid state, keeping the concentration of the etching solution stable, and the ability to provide a safer working environment. The present invention is designed to meet these needs by providing a more efficient, contaminant-free apparatus and method than those currently available such that semiconductor workpieces can be effectively cleaned and recycled to reduce manufacturing costs.

SUMMARY OF THE INVENTION

Accordingly, it is an object of the invention to provide, in one aspect, an ultrasonic etching apparatus for chemically-etching a workpiece. In one embodiment, the chemical is an acid. Alternatively, the chemical is a base. The apparatus includes an outer tank at least partially filled with an aqueous solution, an inner tank including an chemical-resistant polymer and at least partially disposed within the outer tank and in contact with the aqueous solution. The inner tank is at least partially filled with at least one liter of an acidic or basic solution having a total acidity or basicity of at least 10% wt, and the inner tank has at least a sidewall and a base and defining an upper mouth, and is receptive to the workpiece. Also included in the apparatus is a lid engaged with said mouth of said inner tank, and an ultrasonic transducer coupled to said outer tank to impart ultrasonic energy to the acidic solution in the inner tank.

In one embodiment, the weight of the lid creates at least a partial seal between the mouth of said inner tank and a lower surface of said lid. In a related embodiment the partial seal functions to increase the partial pressure of the gas above the etching solution and/or to prevent escape of chemical gases that may cause a change in the composition of the chemical solution.

In another embodiment of the invention, the apparatus includes a heating element for regulating the temperature of the aqueous solution.

In yet another embodiment, the apparatus includes a mechanism adapted to impart relative motion between the workpiece disposed in the inner tank and the ultrasonic transducer. The mechanism includes, in one embodiment, a rod extending through the lid and coupled to the workpiece.

In still another embodiment, an exhaust hood is included which is located above the tanks and receptive to gases produced from at least one of the aqueous solution and the etching solution.

In yet another embodiment, an ultrasonic buffer is positioned within the aqueous solution for dampening and/or diffusing the sonic energy imparted to the acidic solution.

In one embodiment of the invention, the ultrasonic transducer is positioned outside of the aqueous solution and is operably connected to a power oscillator.

A probe is positioned within the etching solution, in another embodiment of the invention, for monitoring one or more of the ultrasonic energy, temperature, temperature variations and impurity concentration.

In another embodiment, the aqueous solution is a filtered and recirculated deionized water bath.

Preferably, the etching solution is essentially static.

In one embodiment, the inner tank and any portion of the rotational mechanism that may come into contact with the etching solution comprises a chemically-resistant polymer material selected from the group consisting of a fluorine resin and high density polyethylene.

In another embodiment, the inner tank generates less than 10 ppb of leachable metal contaminants and 10 ppm of leachable anionic and organic contaminants.

In yet another embodiment, the etching solution is acidic and includes a chemical selected from the group consisting of hydrofluoric acid, nitric acid and hydrochloric acid. In a related embodiment, the acidic solution is hydrofloric acid, nitric acid and water in a ratio of 1:1:1 Alternatively, the etching solution is basic and includes a chemical selected from the group consisting of sodium hydroxide and potassium hydroxide.

In still another embodiment, the temperature of the aqueous solution is maintained from about 20° C. to about 50° C.

In yet, still another embodiment, the workpiece is selected from the group of materials consisting of silicon carbide, quartz and silicon.

In one embodiment of the invention, the mechanism includes a rotary motion actuator for rotating said substrate about an axis. In a related embodiment, the axis is a substantially horizontal axis. Alternatively, the axis is a substantially vertical axis.

In another embodiment, the mechanism includes a rotary motion actuator for rotating said inner tank and/or said ultrasonic transducer.

In yet another embodiment, the lid has a cross-section which is substantially the same as the cross section of the mouth of the inner tank.

In still another embodiment, the mouth of the inner tank and the lid each have a circular shape corresponding to the cross-section of the lid.

In yet another embodiment, the cross-section of the inner tank is substantially the same as the cross section of the workpiece.

In yet, still another embodiment, the mouth of the inner tank has a shape of a square, rectangle, triangle, circle or ovals.

The inner tank of the apparatus, in another embodiment, has a shape of a rectangular parallelpiped, cube or cylinder.

Accordingly, it is another object of the invention to provide, in one aspect, a method for ultrasonically chemically-etching a workpiece. The steps involved in practicing the method include providing an inner tank having an inner surface comprising a chemical-resistant polymer and defining an upper mouth and being receptive to the workpiece, wherein said inner tank is at least partially disposed within an outer tank at least partially filled with an aqueous solution, at least partially filling the inner tank with at least 1 liter of an etching solution having a total acidity or basicity of at least 10%, immersing the workpiece into the etching solution, covering the mouth of the inner tank with a lid to enclose the etching solution and to increase the partial pressure above the etching solution such that the chemical concentration of the etching solution remains substantially the same; and ultrasonically agitating the etching solution with an ultrasonic trasducer coupled to an outer tank to accelerate the etching of the workpiece.

In one embodiment of the method, the weight of the lid creates at least a partial seal between the mouth of said inner tank and a lower surface of said lid.

In another embodiment, method includes providing a heating element for regulating the temperature of the aqueous solution.

In still another embodiment, the method includes providing a mechanism adapted to impart relative motion between the workpiece immersed in the inner tank and the ultrasonic transducer.

In yet another embodiment, the mechanism includes a rod extending through the lid and coupled to the workpiece.

In yet, still another embodiment, the method further includes providing an exhaust hood which is located above the tanks and receptive to gases produced from at least one of the aqueous solution and the etching solution.

The method, in one embodiment, further includes an ultrasonic buffer positioned within the aqueous solution for dampening and/or diffusing the sonic energy imparted to the etching solution.

In another embodiment, the ultrasonic transducer is positioned outside of the aqueous solution and is operably connected to a power oscillator.

In still another embodiment, the method further includes providing a probe positioned within the etching solution for monitoring one or more of the ultrasonic energy, temperature, temperature variations and impurity concentration.

In yet another embodiment, the aqueous solution is a filtered and recirculated deionized water bath.

In yet still another embodiment, the etching solution is essentially static.

The inner tank and any portion of the mechanism that may come into contact with the etching solution, in one embodiment, includes a chemically-resistant polymer material selected from the group consisting of a fluorine resin and high density polyethylene.

In another embodiment, the inner tank generates less than 10 ppb of leachable metal contaminants and 10 ppm of leachable anionic and organic contaminants.

In yet another embodiment, the etching solution comprises an acid selected from the group consisting of hydrofluoric acid, nitric acid and hydrochloric acid. In a related embodiment, the etching solution includes hydrofloric acid, nitric acid and water in a ratio of 1:1:1.

In yet another embodiment, the etching solution comprises a base selected from the group consisting of sodium hydroxide and potassium hydroxide. In a related embodiment, the etching solution comprises 30% potassium hydroxide.

In yet, still another embodiment, the temperature of the aqueous solution is maintained from about 20° C. to about 50° C.

The workpiece may be silicon carbide, quartz or silicon, in one embodiment.

In another embodiment, the mechanism includes a rotary motion actuator for rotating said substrate about an axis.

In yet another embodiment, the axis is a substantially horizontal axis. Alternatively, according to another embodiment, the axis is a substantially vertical axis.

In one embodiment, the mechanism comprises a rotary motion actuator for rotating said inner tank and/or said ultrasonic transducer.

In another embodiment, the cross-section of the lid is substantially the same as the cross section of the mouth of the inner tank.

In yet another embodiment, the mouth of the inner tank and the lid each have a circular shape corresponding to the cross-section of the lid.

In still another embodiment, the cross-section of the inner tank is substantially the same as the cross section of the workpiece.

These and other objects and features of the invention will be more fully appreciated when the following detailed description of the invention is read in conjunction with the accompanying drawings.

DETAILED DESCRIPTION OF THE INVENTION

I. Definitions

Figure 1:
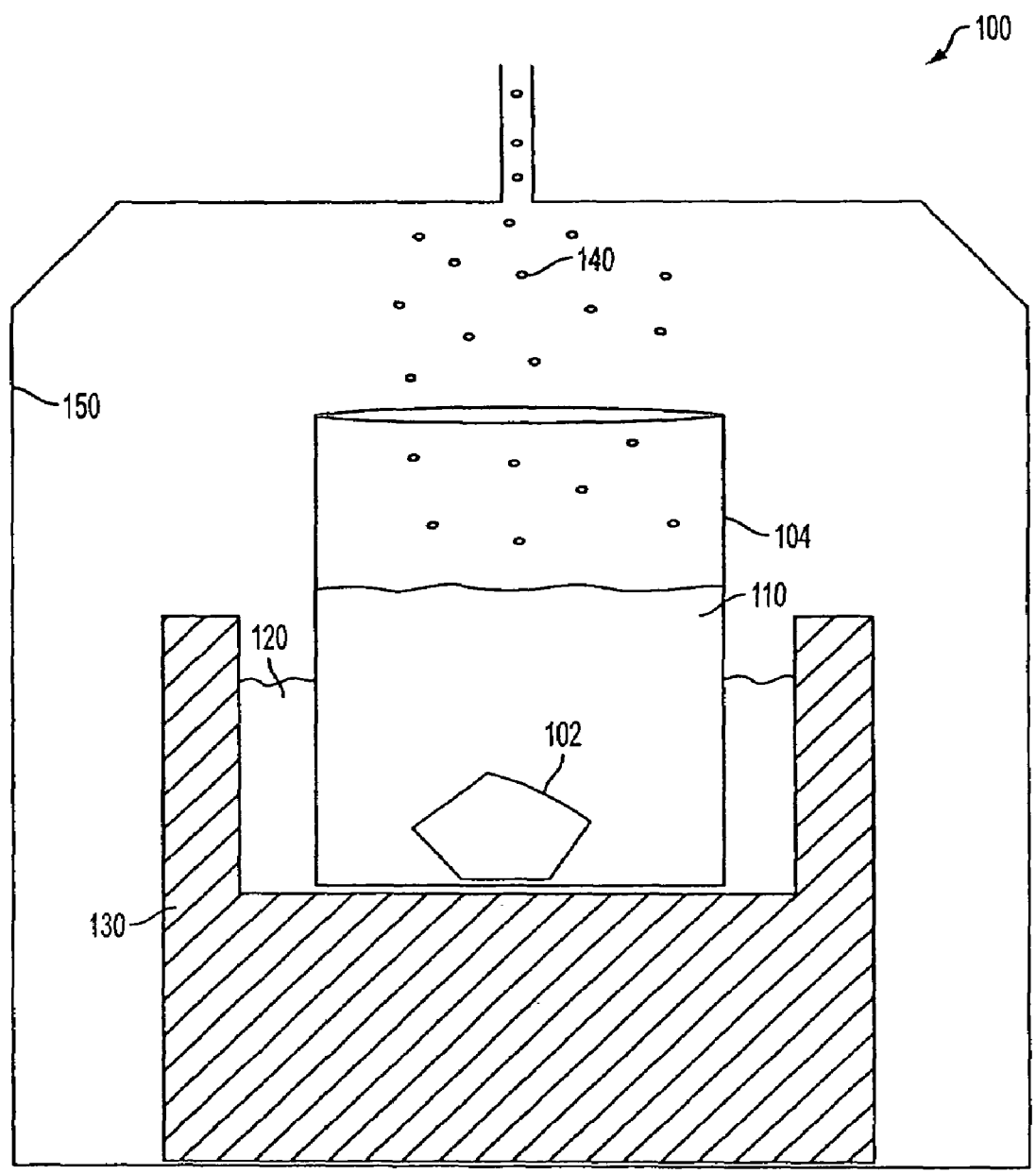
FIG. 1 is an illustration of a prior art ultrasonic acid-etching apparatus.
Figure 2:
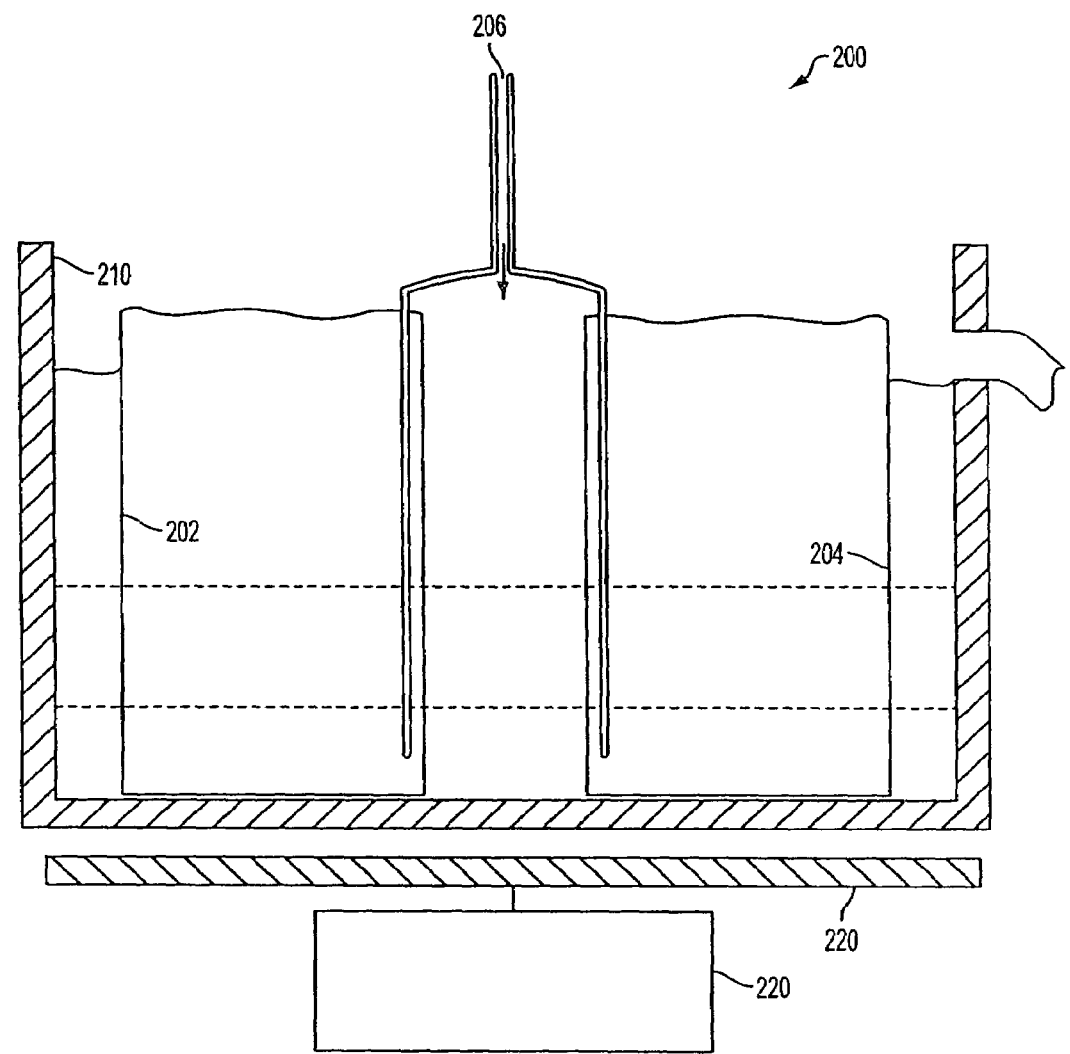
FIG. 2 is an illustration of a prior art ultrasonic water-cleaning overflow apparatus.

Unless otherwise indicated, all technical and scientific terms used herein have the same meaning as they would to one skilled in the art of the present invention. It is to be understood that this invention is not limited to the particular methodology, protocols, and reagents described, as these may vary. All publications and patents cited herein are expressly incorporated herein by reference for the purpose of describing and disclosing compositions and methodologies which might be used in connection with the invention.

As used herein, the term "etching" refers to the selective removal of material and includes, but is not limited to, cleaning, texturing and polishing.

By "chemical-resistant polymer" is meant that the polymer composition can be maintained in contact with solutions of high acid or base molarity for time sufficient to etch a workpiece, and preferably can remain in contact with the solution for extended periods of time without suffering degradation of the polymer.

As used herein, "ultrasonic" generally refer to acoustic disturbances in a frequency range above about eighteen kilohertz and which extend upwards to over two megahertz.

As used herein, a "workpiece" refers to a part which is undergoing a manufacture, etching, texturing, or cleaning operation within liquid subjected to ultrasonic energy. By way of example, one workpiece is a semiconductor wafer which has extremely small features; other examples include semiconductor process chamber components such as a gas distribution plate, dome/roof or wafer chuck. A workpiece often defines components in the computer industry, including disk drives, semiconductor components, and the like.

The term "lid" as it is used herein, is defined broadly to include any type of container closure cap, cover, stopper, plug, crown, top, plate or the like, as a function of the container type, which functions as a closure which at least partially seals the tank.

The term "hermetic seal" refers to a seal that is gas- and liquid-tight between two members, e.g. a mouth of a tank and a lid.

By "clean," it is meant that the chemical-resistant polymer, e.g. polyethylene or a fluorocarbon, will not introduce contaminants into a acidic solution in excess of leachable metallic contaminants of 10 ppb, and leachable anionic and organic contaminants of 10 ppm. These contaminants may be present on the surface of the material that is in contact with the etching solution, or can be "leached" from the material of the tank or lid by the acid or base.

By "chemically inert" it is meant that the etching solutions will not substantially change the chemical or physical properties of the chemically-resistant polymers.

By "compatible" it is meant that the etching solutions are physically compatible with characteristics of the material such as the material's porosity. In other words, a chemical sample can be considered to be incompatible with the material (even if it is chemically inert with respect to that material) if the sample, due to small molecular size and high mobility, has the ability to migrate through microscopic pores in the walls of the material.

II. Apparatus and Method of the Invention

The invention provides, in one aspect, an apparatus and integrated system for ultrasonically chemically-etching a workpiece. It has been discovered that the apparatus, as described in detail below, provides a number of advantages over the prior art, including: minimization of exposure of the etching solutions to the immediately surrounding environment which reduces unwanted contaminants from the apparatus from entering these solutions, the ability to controllably adjust the partial pressure of the etching solution to inhibit the formation of dangerous vapors, the ability to scale-up processing of workpieces, the ability to provide a safer working environment and to prevent the change of chemical composition of the etching solution. Considered below are the components of the apparatus.

Figure 3A:
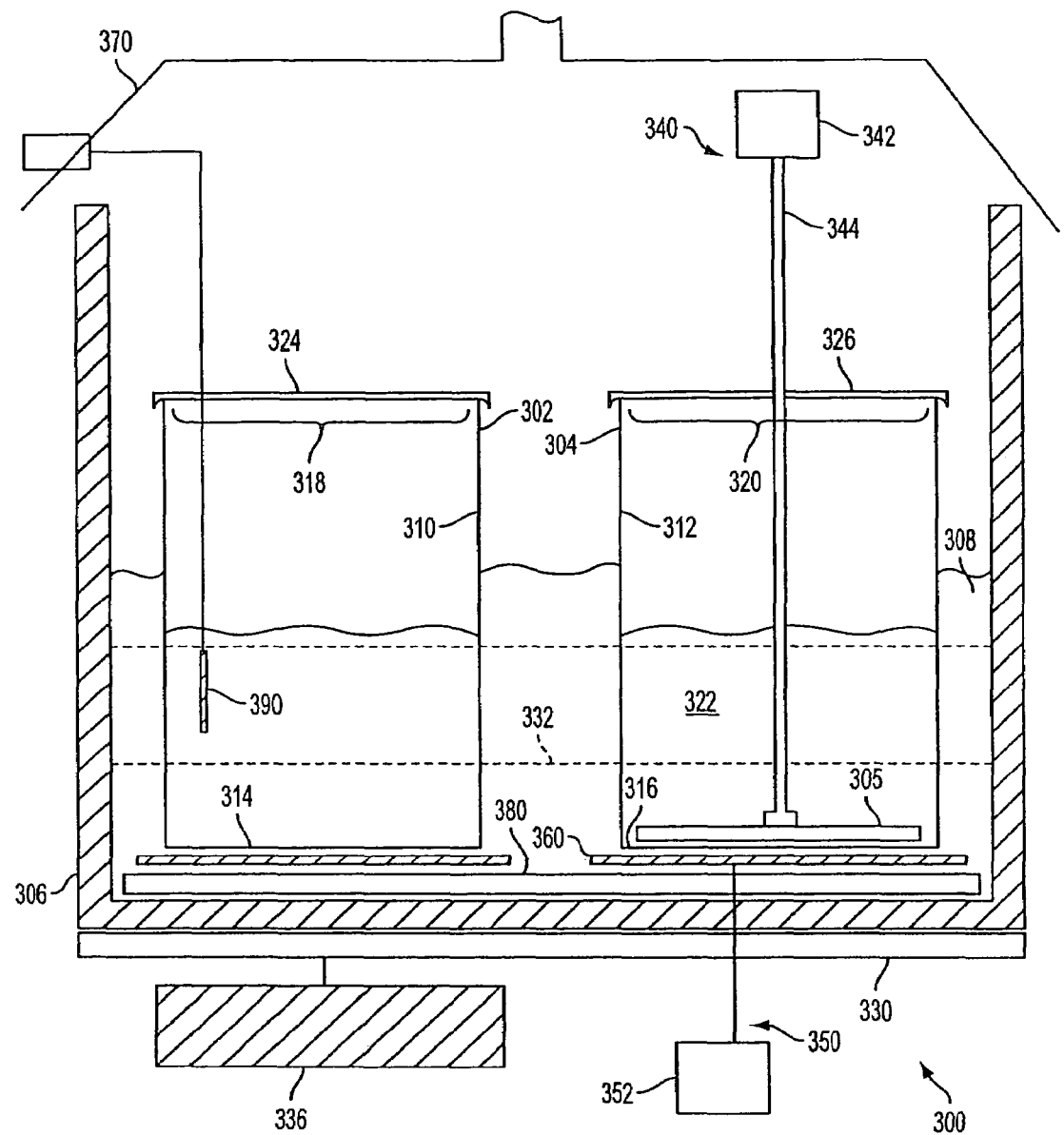
FIG. 3a is an illustration of an apparatus for etching a chamber part or other workpiece using an acid or base according to one embodiment of the invention.

FIG. 3a shows an apparatus 300 according to one embodiment of the invention. Apparatus 300 includes two inner tanks 302 and 304 formed of or coated with a chemical-resistant polymer. Chemical-resistant polymers include high density hydrocarbon polymers (e.g. high density polyethylene) available commercially from sources such as Nalgene, Inc. (distributed by VWR in the U.S.; www.nalgene.com) and Norton Performance Plastics Corporation (Wayne, N.J.), and fluorocarbon polymers (e.g. perfluoroalkoxy, fluorinated ethylene propylene and polytetrafluorethylene) which are commercially available from DuPont de Nemours, Inc. (Wilmington, Del.) under the tradename of Teflon (www-.teflon.com).

Containers and chemicals that may be useful in certain embodiments of the invention are described in U.S. Pat. No. 5,804,744, issued Sep. 8, 1998; U.S. Pat. No. 5,996,424, issued Dec. 7, 1999; and U.S. Pat. No. 6,003,666, issued Dec. 21, 1999; each of which is incorporated herein by reference in its entirety. The tanks may be pre-cleaned, if desired, by, e.g. sequentially soaking the tanks in two types of concentrated acid for around two weeks and then rinsing for several days in ultra-pure water.

It should be noted that there are both low density polyethylene and high density polyethylene resins available on the market. Low density polyethylene is easier to work with and is more flexible (ie. more "plastic"), but is less chemically resistant than high density polyethylene. The present invention contemplates the use of a "medium density" polyethylene by mixing low density polyethylene resin with high density polyethylene resin to produce a blend that is easier to work with and more flexible than high density polyethylene, but which is more chemically resistant than low density polyethylene.

The described materials are preferred because they can be manufactured in a clean fashion, are chemically inert to the chemicals of interest, and are compatible with the chemicals of interest. Since all three of these features are important, the terms "clean", "chemically inert", and "chemically compatible" have been described in greater detail in Section I, above.

Of the two preferred material types of the present invention, polyethylene is desirable in that it is relatively inexpensive and is easier to work with than fluorocarbon polymers. When manufactured into a tank and/or lid of the present invention, the resultant article of manufacture includes less than 10 part per billion (ppb) of leachable metallic contaminants and less than 10 part per million (ppm) of leachable anionic and organic contaminants, both on the surface of the article and being extracted from the materials of the article of manufacture by the etching solutions.

Fluorocarbon polymers are relatively more expensive and are harder to work with, but have the advantage of being commonly accepted in the semiconductor industry for high purity applications. The apparatus of the present invention includes, in a preferred embodiment, the use of a fluorocarbon inner tank and/or lid which have leachable metallic contaminants of less than 1 ppb, and extractable anionic and organic contaminants less than 1 ppm.

The aforementioned materials have been found to be chemically inert and compatible with most chemicals used in the manufacture of semiconductors. For example, the materials of the inner tank and lid of the present invention are both chemically inert and compatible with hydrofluoric acid (HF), hydrochloric acid (HCL), sulfuric acid ($H_2SO_4$), phosphoric acid ($H_3PO_4$), nitric acid ($HNO_3$), acetic acid ($CH_3COOH$), hydrogen peroxide ($H_2O_2$), ammonium hydroxide ($NH_4OH$), tetramethyl ammonium hydroxide (TMAH), sodium hydroxide (NaOH), potassium hydroxide (KOH) and isopropyl alcohol (IPA). Fluorocarbon embodiments of the present invention, in particular, are chemically inert and compatible with all of the mentioned chemicals.

With reference again to FIG. 3a, the inner tanks 302 and 304 are at least partially disposed within outer tank 306, and include sidewalls 310 and 312, bases 314 and 316 and mouths 318 and 320. Outer tank 306 is at least partially filled with an aqueous solution 308 capable of transmitting ultrasonic energy. Preferably, the aqueous solution is water. In an embodiment not shown, the outer tank may include a circulator that removes particles by filtering the aqueous solution and returning it to the outer tank. In order to minimize decreases in the temperature of the aqueous solution described above, an aqueous solution heating element may be provided on the aqueous solution supply and/or circulation line, if any, to preheat the aqueous solution to a predetermined temperature before being supplied into the outer tank.

Inner tanks 302 and 304 are at least partially filled with an etching solution 322, such as hydrofluoric acid, nitric acid and/or hydrochloric acid; or bases such as NaOH or KOH, for cleaning, etching and/or texturing workpiece 305, which is typically formed of silicon, ceramic (e.g., AlN, $Al_2O_3$), quartz and/or silicon carbide. The chemically-resistant polymers should not introduce contaminants such as metals, anions and organics into the acidic solution. The inner tanks preferably generate less than 10 ppb of leachable metal contaminants and 10 ppm of leachable anionic and organic contaminants.

Preferably, the tanks are filled with at least one liter, more preferably at least ten liters, and even more preferably at least thirty liters of the etching solution. The total acidity or basicity will vary according to the desired application or workpiece, but will typically range from about 1% to about 40%. A preferable acidity or basicity is at least about 10%. The etching solution includes acids, such as hydrofluoric acid, nitric acid and water in various ratios, e.g., 1:1:1, 1:2:2, or 1:7:2. In another embodiment, the etching solution comprises various ratios of basic solutions, e.g. 5-50% or 20-30% KOH and 50-95% or 70-80% water, respectively. The etching solution may be adjusted depending on the substrate, time, temperature, etch depth, movement/rotation of the workpiece and/or other parameters as will be apparent to those of skill in the art. Exemplary ratios of acids and bases for etching quartz and polysilicon substrates are described in Examples 1-3.

Figure 3B:
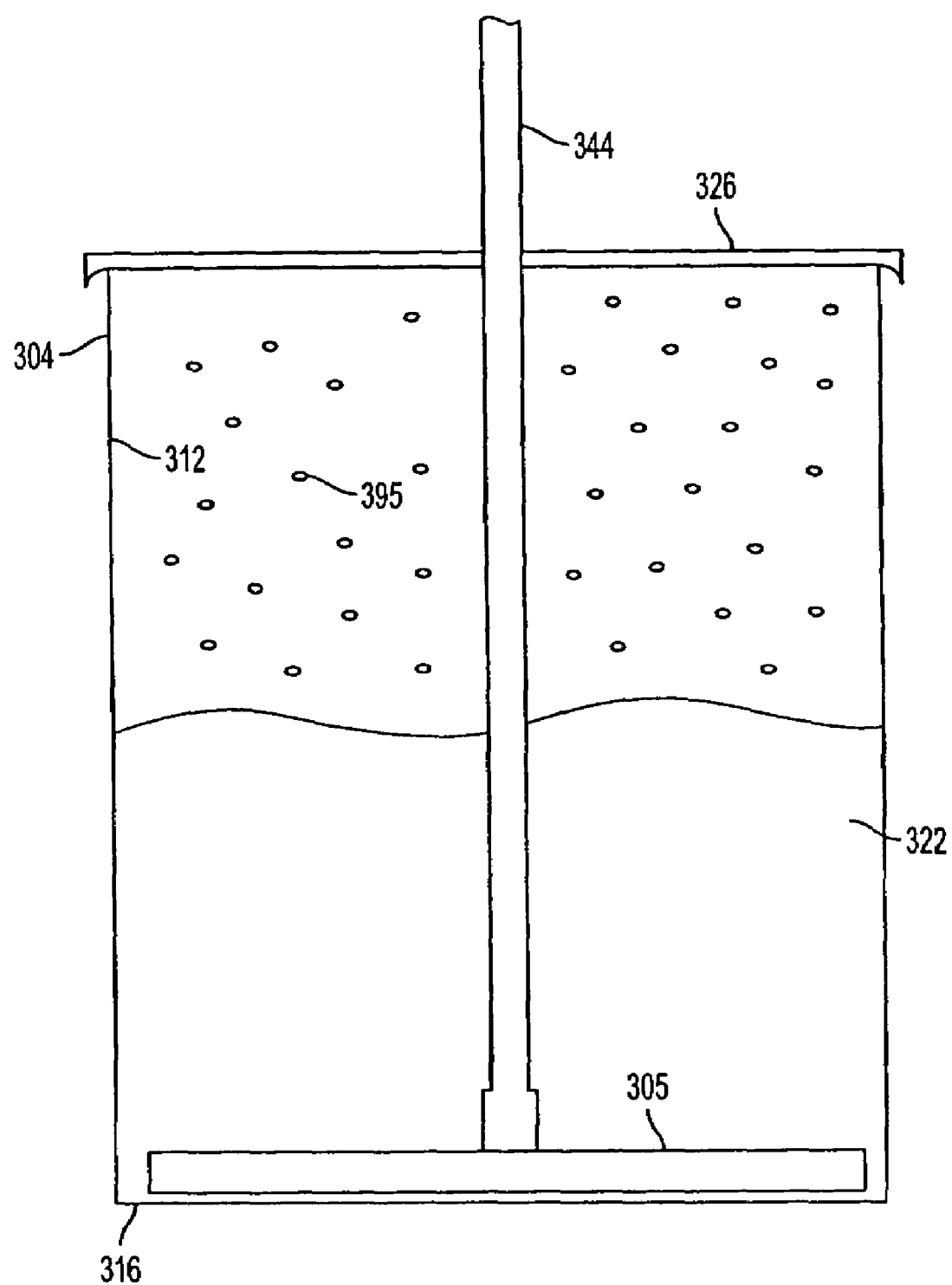
FIG. 3b is an illustration of the inner tank showing the increase in partial pressure according to one embodiment of the invention.

Lids 324 and/or 326 are placed on top of inner tank mouths 324 and 326, the shape of which may be square, rectangle, triangle, circle, oval or the like. Preferably, the cross-section of the lids are substantially the same as the cross-section of the mouth of the inner tank mouths. The lids create at least a partial seal between the mouth of the inner tanks and the lower surfaces of the lids. In one embodiment, the seal is a hermetic seal. As indicated in FIG. 3b, it should be appreciated that the lid 326 also functions to increase the partial pressure of the gases 395 above the etching solution 322 such that less aerosol formation and/or vaporization of the etching solution occurs by keeping it in a liquid state and preventing a concentration change of the etching solution. In one embodiment, the lid also functions as a simple safety valve capable of releasing pressure before dangerous levels are achieved, e.g. before the etching solution reaches a certain temperature. The lid is also preferably formed of a chemical-resistant polymer. For gases that may escape from the inner or outer tanks, an exhaust hood 370 is provided which is located above the tanks and receptive to and/or compatible with these gases.

In one embodiment of the invention, an at least partly deformable, chemical-resistant coating of e.g. a medium-density polyethylene or Teflon®, as described above, is provided on the mouth of the inner tank and/or bottom surface of the lid and is compressed on sealing the inner tank with the lid. Under pressure and heat the coating undergoes deformation and consequently forms a sealing closure of the inner tank interior. This is particularly advantageous during etching of the at least partially filled sealed inner tank, so as to ensure that during etching the inner tank does not leak due to the pressure occurring in the interior thereof. The deformable coating provided in this embodiment also has the advantage of permitting a tighter seal, if desired, following extended use of the inner tank and/or lid.

Apparatus 300 also includes an ultrasonic transducer 330 which is coupled to power oscillator 336 and outer tank 306 such that it imparts ultrasonic energy to etching solution 322 in inner tanks 302 and 304. The ultrasonic transducer agitates chemical solution 322 through aqueous solution 308 to accelerate the etching of workpiece 305. In the embodiment shown, the ultrasonic transducer is positioned outside of the aqueous solution. However, in another embodiment, the transducer is positioned within the aqueous solution. A plurality of ultrasonic transducers may be employed, if desired, as described, e.g. In U.S. Pat. No. 6,181,052 (Jan. 30, 2001), entitled "Ultrasonic generating unit having a plurality of ultrasonic transducers," which is incorporated herein by reference. Ultrasonic transducers may be purchased commercially from a number of sources such as Branson or Misonix (www.misonix.com). Methods for controlling various frequency ranges of ultrasonic energy are described in U.S. Pat. No. 6,433,460 (Aug. 13, 2002), which is incorporated by reference herein. Ultrasonic energy is typically between 25-40 kHz or greater. However, the energy may be adjusted as desired depending on additional parameters as discussed above. Ultrasonic power typically ranges from 30-50 watts/gallon, but may also be varied to include powers that are less or greater than this range.

A heating element 332 is also included in apparatus 300. The heating element is thermally coupled to the side wall of outer tank 306 such that it may be used for regulating the temperature of aqueous solution 308. It has been discovered that controllable chemical etching may be achieved at higher temperatures. The temperature is inversely proportional to the time required for etching the workpiece and may be related to additional parameters as discussed above. Thus, an advantage of coupling the heating element to the apparatus of the invention is that time required for etching may be reduced, which allows for an increase the throughput for etching a plurality of workpieces. Typically, the temperature is adjusted to between about 18-45 degrees Centigrade.

Apparatus 300 also includes mechanisms 340 and 350 for rotation such that relative motion is achieved between workpiece 305 and ultrasonic transducer 330. Mechanism 340 includes a motor 342 and rod 344 extending through lid 326 for rotating substrate 305 about a vertical axis. However, the rotating mechanism is not limited to the construction shown, and may be modified with bevel gears, belts or the like to transmit a driving torque by the motor 342 to rod 344 such that substrate 305 is rotated about a substantially horizontal axis. See, e.g. U.S. Pat. No. 6,199,563 (Mar. 13, 2001), which is incorporated by reference herein. Alternatively, turntable 360 may be rotated by mechanism 350, which includes motor 352 and means 354 for generating a signal for the rotation of turntable 360. Alternatively, or in combination with the rotation of the workpiece, ultrasonic transducer 330 may be rotated such that relative motion is achieved between the workpiece disposed in the inner tank and the ultrasonic transducer. In a preferable embodiment, the workpiece is rotated slowly, e.g. from about 1 rpm to about 20 rpm, such that uniform etching of the workpiece is achieved.

An ultrasonic buffer 380 is positioned within the aqueous solution for dampening and/or diffusing the sonic energy imparted to etching solution 322. This diffusion and dampening of the energy allows greater control over the etching process. Thus, although the material for forming the buffer is preferably a chemical-resistant polymer, the dimensions of the buffer will vary depending on the amount of energy dampening or diffusion desired.

A probe 390 is positioned within etching solution 322 for monitoring the ultrasonic energy, temperature, temperature variations, impurity concentrations and the like of any of the components of the apparatus, e.g. the etching solution and/or aqeous solution. The probe is preferably formed of, or coated with, an acid-resistant polymer as described above. One or more additional probes, not shown, may be positioned within or near any of the components of the apparatus for monitoring any of the parameters described above. In one embodiment, the aqueous solution is maintained from about 20° C. to about 50° C. Because the inner tank is immersed in the aqueous solution, the etching solution has substantially the same temperature as is maintained in the aqueous solution. As noted above, typically, the higher the temperature of the etching solution, the higher the rate of the etching process, and therefore the faster the workpiece has material removed from its surface. Thus, the temperature of the aqueous solution and the time the workpiece remains in the etching solution are dependent upon the amount of material sought to be removed from the workpiece. These parameters may be adjusted accordingly by one of skill in the art, and are typically adjusted to achieve a uniform etch depth of between about 1 to about 1000 μm, depending on the application, e.g., removal of damage, etc. Exemplary time and temperature parameters for etching various depths workpieces at various rates are given in Examples 1-3.

In order to increase laboratory throughput and to further decrease exposure of laboratory workers to the hazardous reagents described herein, robotic systems which incorporate one or more of the components of the apparatus and/or the method steps may be employed. For example, robotic introduction of solutions (acidic, basic or aqueous) into the tanks, rotations of the workpiece and/or transducer and temperature control may be performed to enhance throughput of the etching process. Thus, in one embodiment of the invention, the inoculating step is performed by a robotic or automated system that has been developed for performing such a task.

Any of the operations to be performed, as described below, on individual members (e.g. workpieces, inner or outer tanks, transducers, probes, etc.) can be performed sequentially or in parallel. Certain physical formats are well suited to parallel operations (i.e., having the same or similar operations performed by approximately simultaneous additions of relevant solutions to the tanks, or approximately simultaneous removal of workpieces from the tanks, and/or other operations). Robotic or other manipulations can be performed such that the actual motions used to achieve selective or parallel manipulations can be controlled by appropriate controller devices, e.g., computers linked to robotic elements with software comprising instruction sets for regulating the robotic or other material manipulative elements. These computer controlled, automated workstations may include robotic arms which mimic the manual operations performed by a scientist. The nature and implementation of modifications to these devices (if any) such that they can operate as discussed herein will be apparent to persons skilled in the relevant art.

The apparatus and method of the invention may also be used in combination with the methods, apparati and chemicals described in co-owned U.S. Ser. No. 09/945,259, filed Aug. 21, 2001, entitled "Cleaning of Semiconductor Process Equipment Chamber Parts Using Organic Solvents" and U.S. Ser. No. 09/927,263, filed Aug. 10, 2001, entitled "System and Method for Cleaning Semiconductor Fabrication Equipment Parts" each of which is incorporated by reference in its entirety herein.

Figure 4:
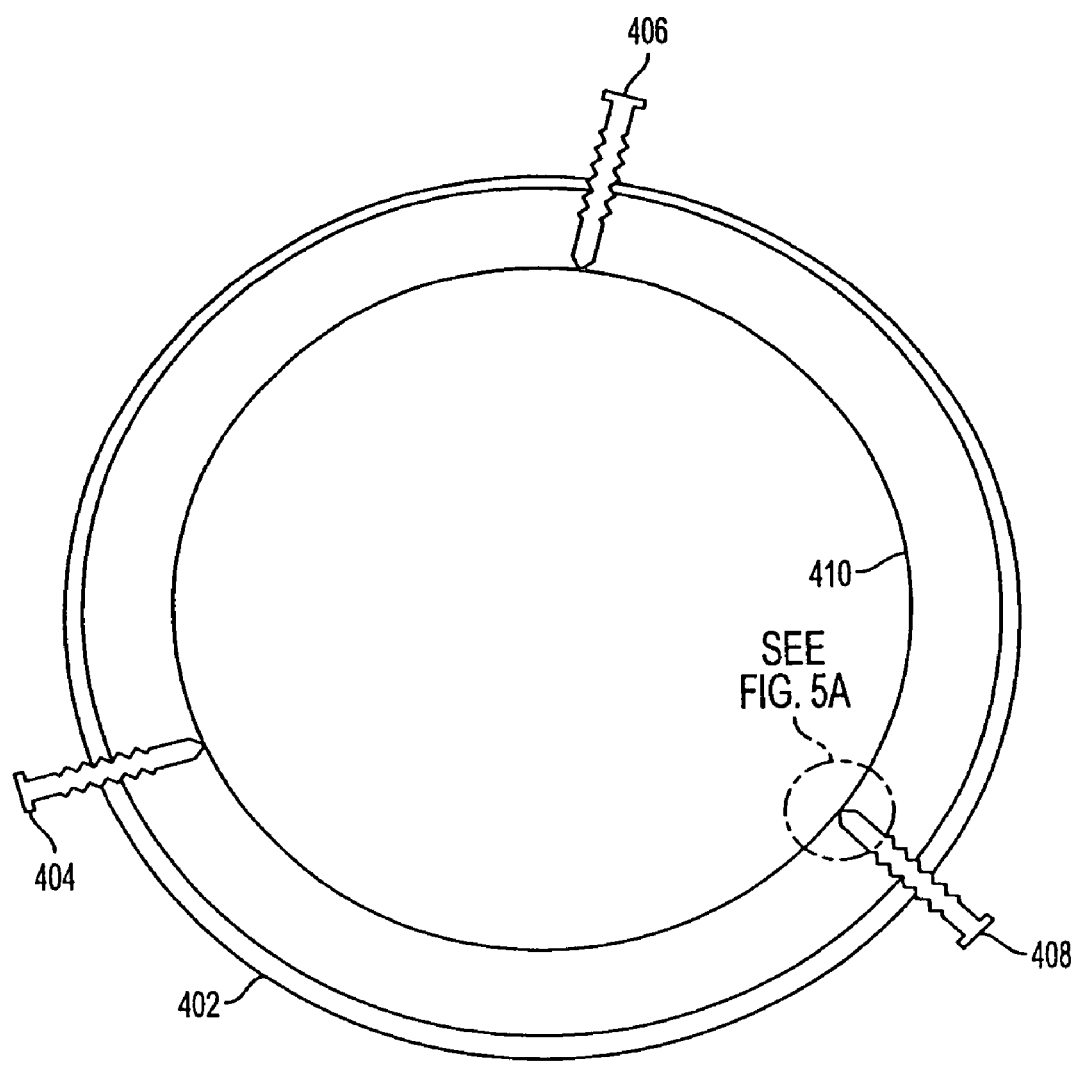
FIG. 4 is an illustration of a jig for holding the outer circumference of a workpiece according to one embodiment of the invention.

FIG. 4 shows a jig 402 adapted to allow screws 404, 406 and 408 to be extended therethrough such that the tips of the screws secure the workpiece 410 in place. The jig and screws are formed of a chemically-resistant polymer, as described above. Following the securing of workpiece 410 to jig 402, the entire device may be positioned within an inner tank as described above such that screws 404, 406 and 408 are in contact with the inner surface of the inner tank. Such a configuration holds the workpiece in place relative to the inner tank during ultrasonic agitation. The jig may be adapted to connect with a rotational mechanism as described above.

Figure 5A:
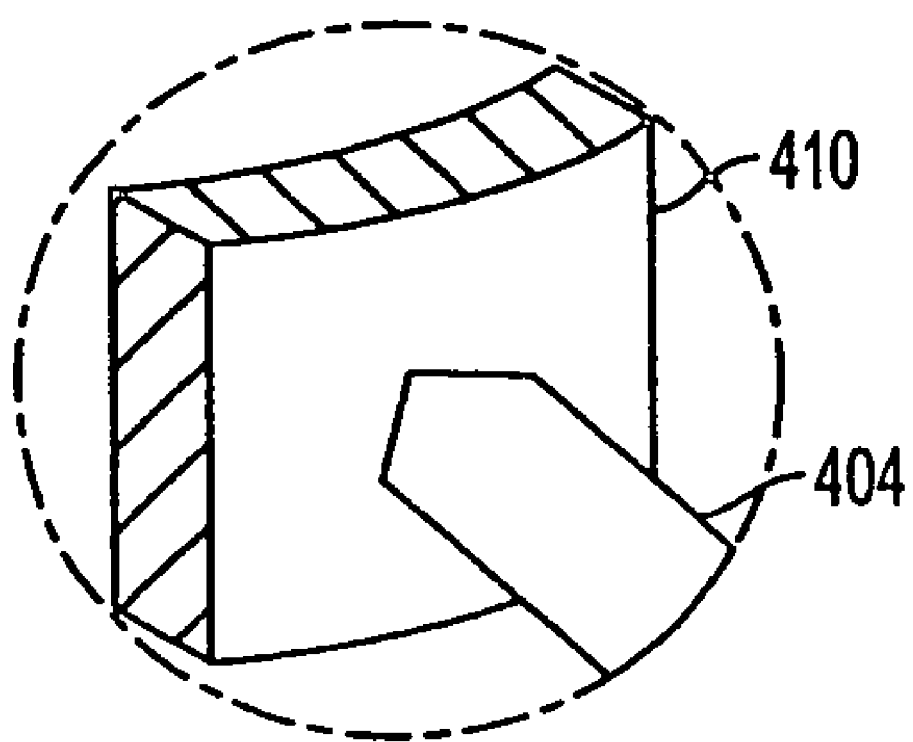
FIG. 5a is an enlarged view showing a screw tip of FIG. 4 according to one embodiment of the invention.
Figure 5B:
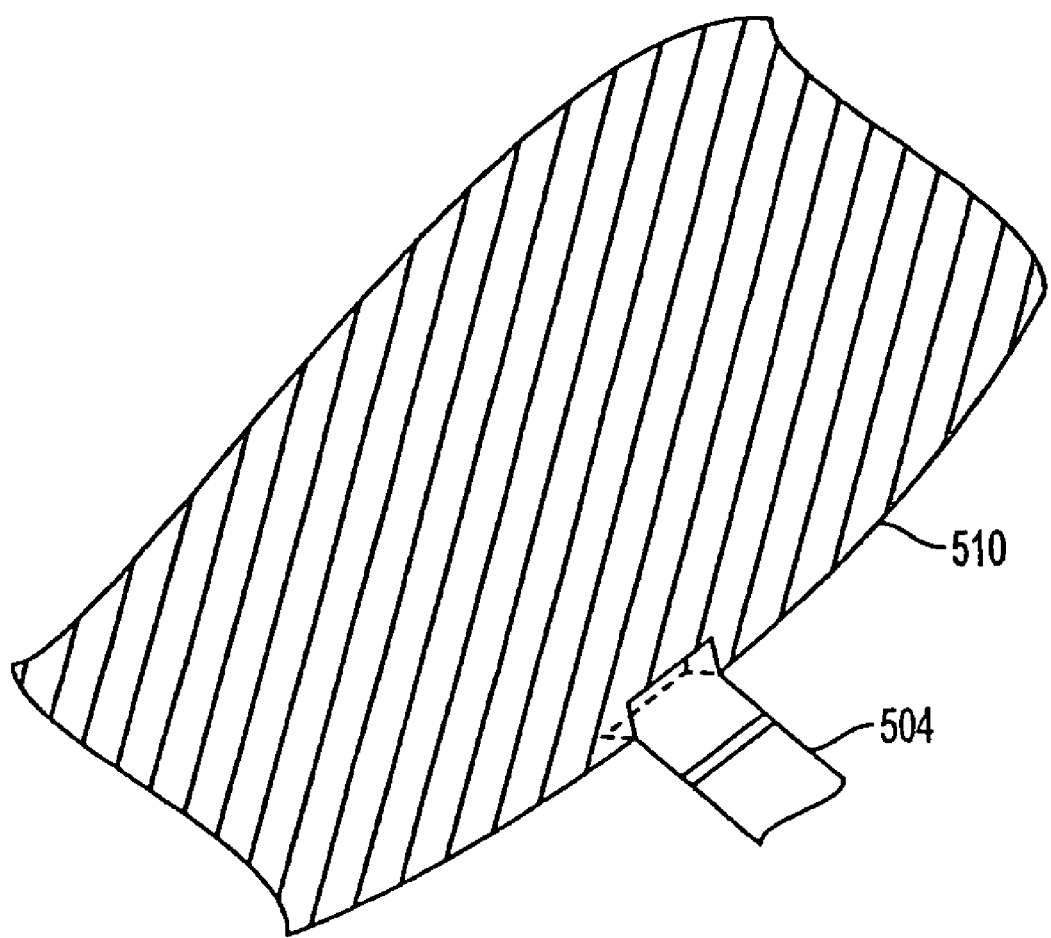
FIG. 5b is an enlarged view showing the slotted screw tip of FIG. 4 according to another embodiment of the invention.

As shown in FIG. 5a, a screw with a substantially pointed tip may be used to secure, e.g. a cylindrical shaped workpiece, while a slotted screw 504 as illustrated in FIG. 5b may be used to secure a wafer shaped workpiece 510.

Figure 6A:
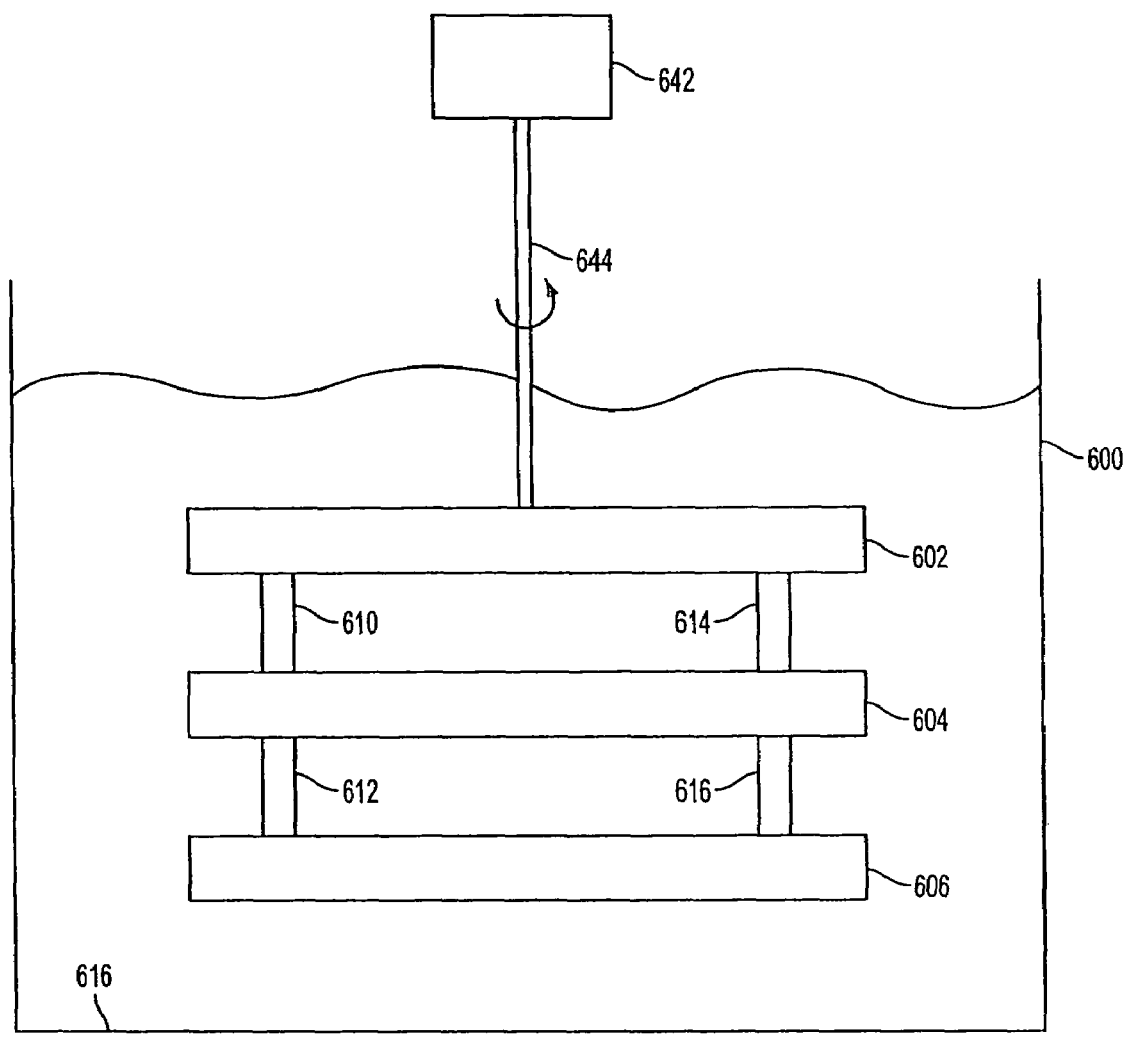
FIG. 6a is an illustration showing a mechanism for rotating the workpiece around a substantially vertical axis according to one embodiment of the invention.
Figure 6B:
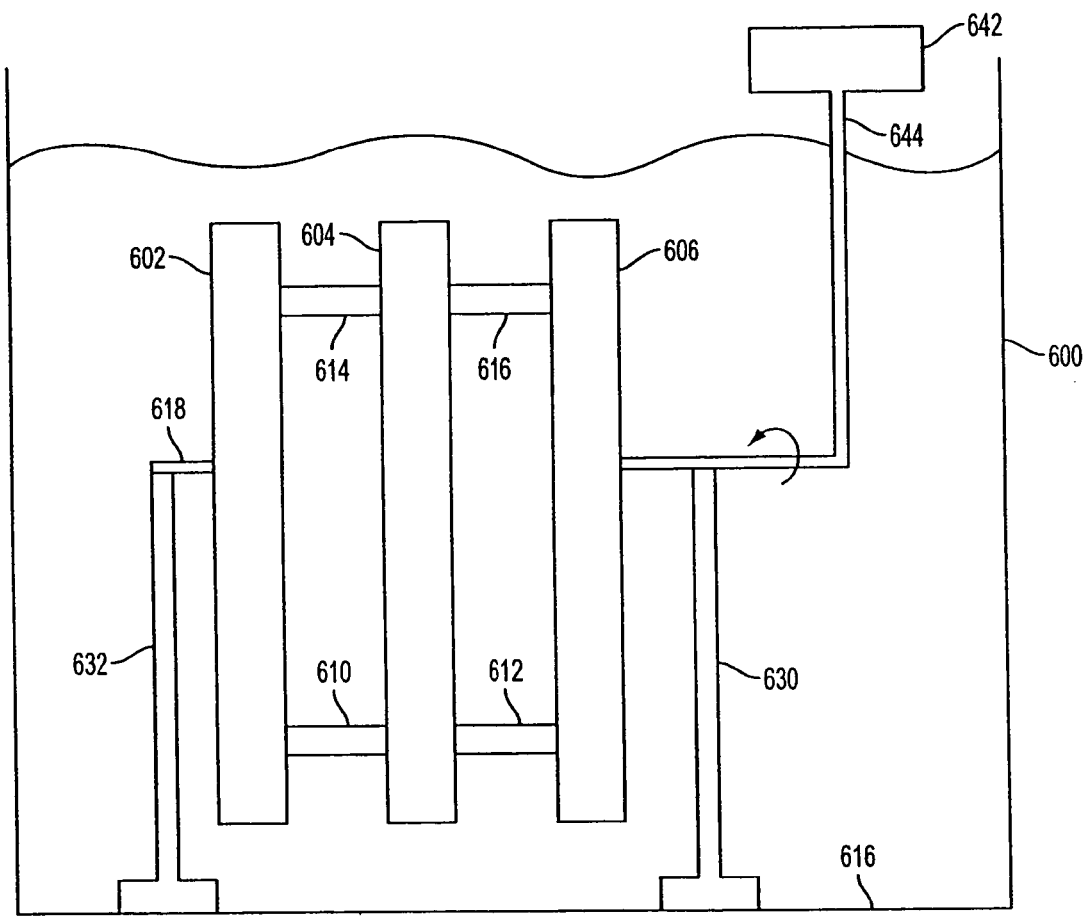
FIG. 6b is an illustration showing a mechanism for rotating the workpiece around a substantially horizontal axis according to another embodiment of the invention.

FIGS. 6a and 6b show variations on the rotational motion that may be achieved by the present invention. FIG. 6a shows three workpieces 602, 604 and 606 connected through connecting rods 610, 612, 614 and 616. The workpieces are coupled to rotational mechanism rod 644 which is connected to motor 642 for rotating the workpieces in a substanially horizontal direction with respect to the base 616 of inner tank 600. Alternatively, as shown in FIG. 6b, workpieces 602, 604 and 606 connected through connecting rods 610, 612, 614 and 616, are coupled to rotational mechanism rod 644 which is further coupled to horizontal rod 618, which is suspended in the inner tank with suspension bars 630 and 632. Rotational mechanism rod 644 is is connected to motor 642 for rotating the workpieces in a substantially vertical direction with respect to the base 616 of inner tank 600.

Figure 7:
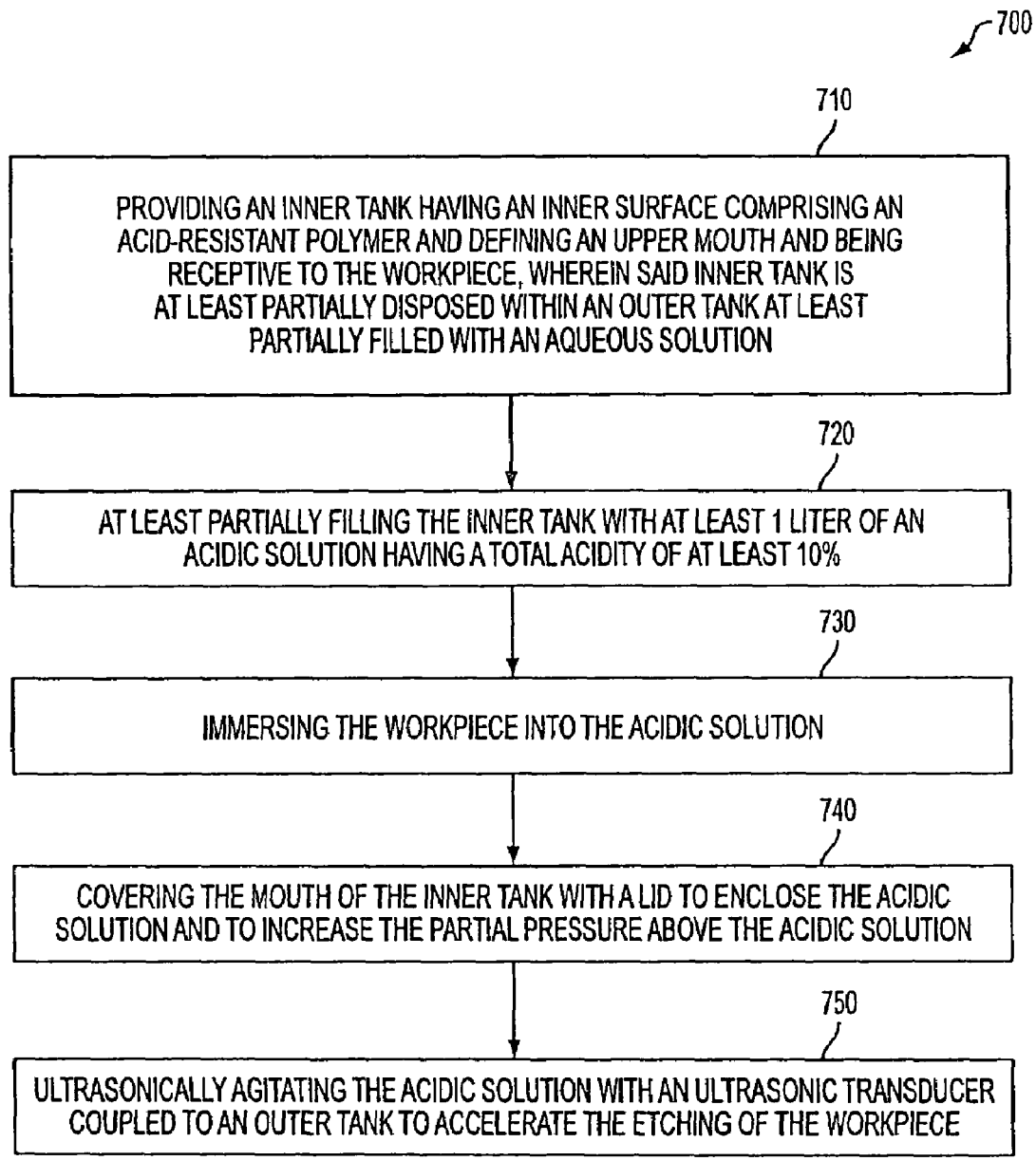
FIG. 7 is a flowchart illustrating a process for ultrasonically acid-etching a workpiece in accordance with the present invention.

FIG. 7 shows a process 700 for ultrasonically etching a workpiece in accordance with one embodiment of the invention. The process 700 starts in operation 710 by providing an inner tank having an inner surface. The inner surface includes a chemically-resistant polymer. The inner tank has an upper mouth that is receptive to a workpiece, and the tank is at least partially disposed within an outer tank which has been at least partially filled with an aqueous solution. The inner tank is then filled with at least one liter, preferably 10 and more preferably 30 liters of an etching solution having a total acidity or basicity of at least about 10%, as given in operation 720. In operation 730, the workpiece is totally immersed into the etching solution. The mouth of the inner tank is then covered in operation 740 with a lid to enclose the etching solution and to increase the partial pressure above the acidic solution. According to operation 750, the etching solution is then ultrasonically agitated with an ultrasonic transducer coupled to the outer tank to accelerate the etching of the workpiece.

The workpiece can be removed after a predetermined period of time to visually inspect and/or test levels of impurities or the degree of etching of the workpiece.

VII. EXAMPLES

The following examples further illustrate the invention described herein and are in no way intended to limit the scope of the invention.

Example 1

For the acidic etching of a quartz workpiece using a 1:1:1 ratio of hydrofluoric acid (49% wt)/nitric acid (70% wt)/water mixture, which corresponds to an acid concentration of 16% wt for HF and 23% wt for $HNO_3$, at 20±5° C., with an ultrasonic energy of 25 to 40 kHz and an ultrasonic power of 30-50 watts/gallon, an etch of 0.5 µm per minute was obtained.

Example 2

A quartz insulator ring from a semiconductor tool is ultrasonically etched with 1:1:1 or 1:2:2 volume ratios of hydrofluoric acid (49% wt)/nitric acid (70% wt)/water at 20±5° C. with an ultrasonic energy of 25 to 40 kHz and an ultrasonic power of 30-50 watts/gallon, to etch off 5 to 100 µm of material. The 1:1:1 volume ratio is 16% wt HF and 23% wt $HNO_3$ and for the 1:2:2 ratio is 10% wt HF and 30% wt $HNO_3$.

Example 3

Polysilicon was isotropically or anisotropically etched using acidic and basic ultrasonic assisted etching processes to remove 5 to 200 µm of material. In one example, a 1:7:2 ratio of hydrofluoric acid (49% wt)/nitric acid (70% wt)/water, which corresponds to a 5% wt for hydrofluoric acid and 7% wt for nitric acid, at 20±5° C. with an ultrasonic energy of 25 to 40 kHz and an ultrasonic power of 30-50 watts/gallon was used to remove the material. In another example, a 30% potassium hydroxide solution at 20±5° C. with an ultrasonic energy of 25 to 40 kHz and an ultrasonic power of 30-50 watts/gallon was used to remove the material.

Although the invention has been described with respect to particular embodiments, it will be apparent to those skilled in the art that various changes and modifications can be made without departing from the invention.

The invention claimed is:

1. An ultrasonic etching apparatus for chemically-etching a workpiece, the apparatus comprising:
    an outer tank adapted to be at least partially filled with an aqueous solution;
    an inner tank comprising a chemically-resistant polymer and at least partially disposed within the outer tank and adapted to be in contact with the aqueous solution, the inner tank adapted to be at least partially filled with an etching solution, the inner tank having at least a sidewall and a base and defining an upper mouth, and being receptive to the workpiece;
    a lid adapted to be engaged with the upper mouth of the inner tank, wherein a weight of the lid is adapted to create at least a partial seal between the upper mouth of the inner tank and a lower surface of the lid to increase a partial pressure of at least one gas above the etching solution;
    an ultrasonic transducer coupled to the outer tank to impart ultrasonic energy to the etching solution in the inner tank; and
    a mechanism adapted to impart relative motion between the workpiece disposed in the inner tank and the ultrasonic transducer;
    wherein the mechanism comprises a rotary motion actuator for rotating at least one of the inner tank and the ultrasonic transducer.

2. The apparatus of claim 1 further comprising a heating element adapted to regulate a temperature of the aqueous solution.

3. The apparatus of claim 1 further comprising an ultrasonic buffer adapted to be positioned within the aqueous solution and to dampen and/or diffuse the sonic energy imparted to the etching solution.

4. The apparatus of claim 1 further comprising a probe adapted to be positioned within the etching solution and to monitor one or more of the ultrasonic energy, temperature, temperature variations and impurity concentration.

5. The apparatus of claim 1 wherein the inner tank is at least partially filled with the etching solution and the etching solution is essentially static.

6. The apparatus of claim 1 wherein the outer tank is at least partially filled with the aqueous solution and a temperature of the aqueous solution is maintained from about 20° C. to about 50° C.

7. An ultrasonic etching apparatus for chemically-etching a workpiece, the apparatus comprising:
    an outer tank adapted to be at least partially filled with an aqueous solution;
    an inner tank comprising a chemically-resistant polymer and at least partially disposed within the outer tank and adapted to be in contact with the aqueous solution, the inner tank adapted to be at least partially filled with an etching solution, the inner tank having at least a sidewall and a base and defining an upper mouth, and being receptive to the workpiece;
    a lid adapted to be engaged with the upper mouth of the inner tank, wherein a weight of the lid is adapted to create at least a partial seal between the upper mouth of the inner tank and a lower surface of the lid to increase a partial pressure of at least one gas above the etching solution to maintain a substantially stable concentration of the etching solution;
    wherein the weight of the lid is selected so that the lid releases at least a portion of the at least one gas before a dangerous pressure level of the at least one gas is present within the inner tank;
    an ultrasonic transducer coupled to the outer tank to impart ultrasonic energy to the etching solution in the inner tank; and
    a mechanism adapted to impart relative motion between the workpiece disposed in the inner tank and the ultrasonic transducer;
    wherein the mechanism comprises a rotary motion actuator for rotating at least one of the inner tank and the ultrasonic transducer.

8. The apparatus of claim 7 wherein the inner tank and any portion of the rotational mechanism that may come into contact with the etching solution comprises a material selected from the group consisting of a fluorine resin and high density polyethylene.

9. The apparatus of claim 8 wherein the inner tank generates less than 10 ppb of leachable metal contaminants and 10 ppm of leachable anionic and organic contaminants.

10. An ultrasonic etching apparatus for chemically-etching a workpiece, the apparatus comprising:
    an outer tank adapted to be at least partially filled with an aqueous solution;
    an inner tank comprising a chemically-resistant polymer and at least partially disposed within the outer tank and adapted to be in contact with the aqueous solution, the inner tank adapted to be at least partially filled with an etching solution, the inner tank having at least a sidewall and a base and defining an upper mouth, and being receptive to the workpiece;
    a lid adapted to be engaged with the upper mouth of the inner tank, wherein a weight of the lid is adapted to create at least a partial seal between the upper mouth of the inner tank and a lower surface of the lid to increase a partial pressure of at least one gas above the etching solution to maintain a substantially stable concentration of the etching solution;
    wherein the weight of the lid is selected so that the lid releases at least a portion of the at least one gas before a dangerous pressure level of the at least one gas is present within the inner tank; and
    an ultrasonic transducer coupled to the outer tank to impart ultrasonic energy to the etching solution in the inner tank wherein the ultrasonic transducer is positioned outside of the aqueous solution and is operably connected to a power oscillator.

11. The apparatus of claim 10 further comprising a heating element adapted to regulate a temperature of the aqueous solution.

12. The apparatus of claim 10 further comprising an ultrasonic buffer adapted to be positioned within the aqueous solution and to dampen and/or diffuse the sonic energy imparted to the etching solution.

13. The apparatus of claim 10 further comprising a probe adapted to be positioned within the etching solution and to monitor one or more of the ultrasonic energy, temperature, temperature variations and impurity concentration.

14. The apparatus of claim 10 wherein the inner tank is at least partially filled with the etching solution and the etching solution is essentially static.

15. The apparatus of claim 10 wherein the outer tank is at least partially filled with the aqueous solution and the temperature of the aqueous solution is maintained from about 20° C. to about 50° C.

16. An ultrasonic etching apparatus for chemically-etching a workpiece, the apparatus comprising:

an outer tank adapted to be at least partially filled with an aqueous solution wherein the aqueous solution is a filtered and recirculated deionized water bath;

an inner tank comprising a chemically-resistant polymer and at least partially disposed within the outer tank and adapted to be in contact with the aqueous solution, the inner tank adapted to be at least partially filled with an etching solution, the inner tank having at least a sidewall and a base and defining an upper mouth, and being receptive to the workpiece;

a lid adapted to be engaged with the upper mouth of the inner tank, wherein a weight of the lid is adapted to create at least a partial seal between the upper mouth of the inner tank and a lower surface of the lid to increase a partial pressure of at least one gas above the etching solution to maintain a substantially stable concentration of the etching solution;

wherein the weight of the lid is selected so that the lid releases at least a portion of the at least one gas before a dangerous pressure level of the at least one gas is present within the inner tank; and an ultrasonic transducer coupled to the outer tank to impart ultrasonic energy to the etching solution in the inner tank.

17. The apparatus of claim 16 further comprising a heating element adapted to regulate a temperature of the aqueous solution.

18. The apparatus of claim 16 further comprising an ultrasonic buffer adapted to be positioned within the aqueous solution and to dampen and/or diffuse the sonic energy imparted to the etching solution.

19. The apparatus of claim 16 further comprising a probe adapted to be positioned within the etching solution and to monitor one or more of the ultrasonic energy, temperature, temperature variations and impurity concentration.

20. The apparatus of claim 16 wherein the inner tank is at least partially filled with the etching solution and the etching solution is essentially static.

21. The apparatus of claim 16 wherein the outer tank is at least partially willed with the aqueous solution and a temperature of the aqueous solution is maintained from about 20° C. to about 50° C.

22. The apparatus of claim 16 further comprising a mechanism adapted to impart relative motion between the workpiece disposed in the inner tank and the ultrasonic transducer.

23. The apparatus of claim 22 wherein the mechanism comprises a rod extending through the lid and coupled to the workpiece.

24. The apparatus of claim 22 wherein the mechanism comprises a rotary motion actuator for rotating the substrate about an axis.

25. The apparatus of claim 24, wherein the axis is a substantially horizontal axis.

26. The apparatus of claim 24, wherein the axis is a substantially vertical axis.

* * * * *